United States Patent [19]
Parker

[11] Patent Number: 5,402,427
[45] Date of Patent: Mar. 28, 1995

[54] CIRCUIT TESTER WITH COINCIDENT SEQUENCING OF INDEPENDENTLY COMPRESSED TEST DATA MATRIX SEGMENTS

[75] Inventor: Kenneth P. Parker, Fort Collins, Colo.

[73] Assignee: Hewlett-Packard Company, Palo Alto, Calif.

[21] Appl. No.: 900,641

[22] Filed: Jun. 18, 1992

[51] Int. Cl.[6] .................................................. G01R 31/28
[52] U.S. Cl. ...................................... 371/27; 324/73.1
[58] Field of Search ......................... 371/27, 24, 22.6; 364/131, 133, 481; 324/73.1

[56] References Cited
U.S. PATENT DOCUMENTS
4,652,814 3/1987 Groves et al. .................... 324/73 R Primary Examiner—Emanuel T. Voeltz
Assistant Examiner—Kamini S. Shah

[57] ABSTRACT

Test connectors connect a circuit tester to an electronic device to be tested. The test vector matrix is divided into segments, each segment including one or more columns of the matrix. The unique vector segments within each matrix segment are stored in RAMs, one RAM for each test connector. A driver/comparator applies an electrical signal to some of the test connectors in response to a signal received from its associated RAM and receives an electrical signal on other of the test connectors and compares it to a signal received from the RAM. There is an independent sequencer for each matrix segment, each sequencer addressing the RAMs for that segment. A clock initiates and clocks the sequencers in synchrony to produce the test on the test connectors from the unique test vector segments stored in the RAMs.

14 Claims, 2 Drawing Sheets

CIRCUIT TESTER WITH COINCIDENT SEQUENCING OF INDEPENDENTLY COMPRESSED TEST DATA MATRIX SEGMENTS

BACKGROUND OF THE INVENTION

1. Field of the Invention

The invention in general relates to electronic circuit testing and more particularly to an apparatus and testing method utilizing an enhanced test data compression technique.

2. Statement of the Problem

The testing of electrical circuits is nearly as old as electrical circuits themselves. In simple circuits this is done by applying small voltages to all the circuit nodes to test for shorts or open circuits. The term node in this specification means any equipotential circuit element; an example is a connecting wire or trace between two electrical components. As circuits have become more complex, it has become ever more important and more difficult to thoroughly test circuits. A common way of doing this is to design a testing apparatus and method as part of the development program for each of the circuit boards that are manufactured as part of a product. Generally a program is developed which operates a complex testing machine that includes hundreds or even thousands of resources, such as voltage drivers and receivers, relays, and tester pins. The drivers and receivers are alternately connected in a programmed, clocked, sequence to the nodes of the device under test (DUT) via the relays and the tester pins which contact test connectors, such as the edge connectors of a board or conducting nails in a nail bed attached to a device under test. In a typical clock period of the programmed sequence, the drivers will force the tester pins contacting certain ones of the nodes of the DUT to prescribed voltages and check that the receivers connected to other tester pins contacting other certain ones of the nodes receive the proper output signals that should be received if the DUT is functioning correctly. If at any clock cycle in the sequence, the proper output signals are not received, the DUT is deemed defective, the defective nodes are recorded or otherwise indicated by the tester, and the test is terminated. The set of digital signals transmitted and received to and from the tester pins on a given clock cycle is called a test vector.

The data signals transmitted and received in a digital test can be effectively viewed as a large matrix of binary data: each of the columns of the matrix being associated with a test pin, and each of the rows of the matrix corresponding to the test vector at a given clock cycle of the tester. This matrix must be stored in some fashion and communicated to the tester during the test. Generally, it is stored on disk or tape or other non-volatile electronic storage device and loaded into RAMs forming part of the tester prior to the test. The complete matrix including the test vectors for each clock cycle of the test is called the "flattened" or "unrolled" form of the test matrix. Storing and using this flattened or unrolled form of the matrix is very RAM intensive and very expensive. Therefore, state-of-the-art digital testers include an electronic system that stores the matrix in a compressed form. See for example, U.S. Pat. No. 4,652,814 which describes a system in which only the unique test vectors are stored in the tester RAMs, and a sequencer stores the sequence of test vectors in the form of processor subroutines, loops, etc. During the test, the sequencer calls up the proper test vectors in sequence, thus constructing the flattened form of the test on-the-fly from the compressed data.

As electronic devices have become more and more complex, the number of connector pins on circuit boards have become very large. There may be as many as a hundred or more such connectors. The number of test pins required to test a circuit board has grown commensurately. As the number of test pins, and thus the size of the test vector, becomes large, it becomes more and more difficult to compress a test. This is because the compression techniques look for sections of a test that are reusable. For example, a sequence of vectors, A, B, C, may recur often in a test, and compression can take advantage of this by storing them once, and reusing them. However, as test vector becomes larger, the chances of it recurring decrease. That is, if only ten pins are used in a test, the chances of identical digital voltages being found on them at different times in a given test is much greater than if a hundred pins are used in a test. Thus, there is a need for a compression technique that is more effective for testers with large test vectors, that is, with large numbers of test pins.

Solution of the Problem

The present invention solves the above problem by providing multiple sequencers that are initialized and clocked by common timing control signals. Otherwise the sequencers are independent.

Each sequencer is associated with a different segment of the test matrix. That is, each sequencer is associated with a different set of tester pins. For example, if there are one hundred test pins, there may be five sequencers, with each sequencer associated with twenty of the tester pins.

Each segment of the test matrix is independently compressed. In the example given above, instead of compressing a matrix of one hundred bit vectors, five matrices of twenty-bit vectors would be independently compressed.

The test is then run by simultaneously initializing and clocking each sequencer and its associated compressed matrix segment to run coincidentally with the all the other sequencers and their associated compressed matrix segments. This reconstructs the test in the flattened form, just as though it had been compressed as a single matrix with a single compression. However, the total compression is significantly greater.

Theoretically, with this technique, if there are n sequencers, each separate compression compresses to the nth root of the compression possible with one sequencer, although in practice the compression advantage is a somewhat less. Thus the total RAM storage in the tester, the size of the storage needed for storing the complete test, and the data transmission time required to transfer the test to the tester, all are significantly less. While the invention requires additional investment in sequencers, the savings in RAM size, storage needs for tests, and the time needed to transfer data to and from the tester, more than makes up for this, with the result that the net size and cost of a tester and the total costs for performing a test are reduced.

SUMMARY OF THE INVENTION

The invention provides an electronic circuit tester comprising: a plurality of conductors for providing an electrical connection to an electronic device to be tested; a plurality of vector storage units, each vector storage unit storing one or more vector segment signals, each vector segment signal corresponding to at least a portion of a unique test vector segment of a test vector; a plurality of driver/comparator means for applying an electrical signal to one of the conductors in response to a vector segment signal received from one of the vector storage units and for receiving an electrical signal on one of the conductors and comparing it to a vector segment signal received from one of the vector storage units; a plurality of sequencer means, each electrically connected to one or more of the vector storage units, for storing compressed test data and causing the one or more of the vector storage units to output the one or more vector segment signals; and clock means for applying a timing signal to each of the sequencer means. Preferably, each of the sequencer means operates independently of the other of the sequencer means, except for the timing signal. Preferably, each of the sequencer means comprises a sequence storage means for storing compressed test data relating to the portion the test applied and received by the driver/comparator means on the conductors associated with the vector storage units electrically connected to the sequencer means, each of the vector segment signals correspond to a portion of the total test matrix, and together all of the portions of the test vector segments stored in the vector storage units plus the compressed test data stored in the sequence storage means reconstruct the entire test matrix. Preferably, the compressed test data stored in each of the sequence storage means comprises unique sequences of unique test vectors. Preferably, the clock means comprises a means for applying an initiation signal and a synchronizing signal to the sequencer means. Preferably, each of the vector storage units comprises a RAM.

In another aspect, the invention provides an electronic circuit tester comprising: a plurality of conductors for providing an electrical connection to an electronic device to be tested; a plurality of vector storage units, each unit storing one or more test vector signals, each signal corresponding to at least a portion of a test vector; a plurality of driver/comparator means for applying an electrical signal to one of the conductors in response to a test vector signal received from one of the vector storage means and receiving an electrical signal on one of the conductors and comparing it to a test vector signal received from one of the vector storage means; a plurality of sequencer means for storing compressed test data and causing one or more of the vector storage means to output the one or more test vector signals; and clock means for applying a timing signal to each of the sequencer means; and wherein each of the sequencer means operates independently of the other of the sequencer means, except for the timing signal, and the test data stored in each of the sequencer means is independent of the test data stored in the other of the sequencer means. Preferably, the compressed test data stored in each of the sequencer means comprises unique sequences of unique test vectors.

The invention also provides a method of testing an electronic circuit comprising the steps of:
dividing a test vector matrix into segments and compressing each matrix segment to the unique vector segments in of the matrix segments; storing each unique vector segment in one or more vector storage units; and sequencing the stored unique vector segments to produce a test corresponding to the test vector matrix on the electronic circuit. Preferably, the step of sequencing comprises storing the unique sequences of vector segments in each of the matrix segments and applying the unique sequences to the vector storage units to produce the test. Preferably, the vector storage units comprise electronic storage devices with the unique vector segments stored at various addresses and the step of sequencing comprises applying the addresses corresponding to the unique sequences to the electronic storage devices to cause the electronic storage devices to output the sequences of the unique vector segments to produce the test. Preferably, there are a plurality of the vector storage units and the step of storing comprises dividing each unique vector segment into two or more portions and storing each portion in a different one of the vector storage units.

The invention not only provides a circuit tester of reduces size and cost, but also permits a more precise determination of the location of the fault in the DUT. Numerous other features, objects and advantages of the invention will become apparent from the following description when read in conjunction with the accompanying drawings.

DETAILED DESCRIPTION OF THE PRIOR ART

Figure 1:
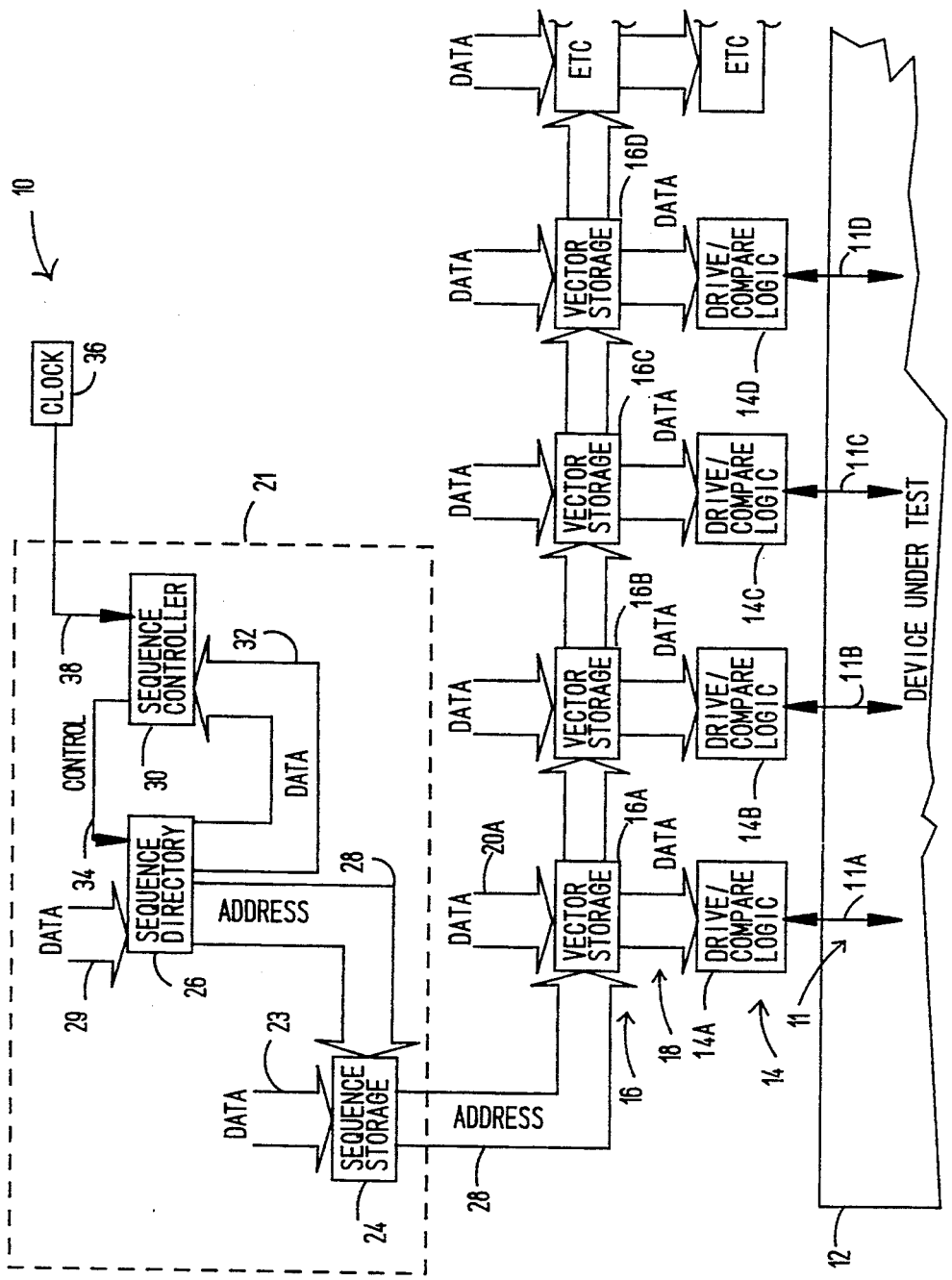
FIG. 1 is a block diagram of a prior art circuit tester.

A circuit tester according to the prior art is shown in FIG. 1. The tester 10 according to the prior art includes n tester pins, such as 11A through 11D, where n may vary from tester to tester, and may anything from a few dozen to several hundred. Each tester pin 11A through 11D has a drive/compare logic unit 14A through 14D, respectively, and a vector storage unit 16A through 16D, respectively, associated with it. The prior art tester 10 also includes a single sequencer 21 comprising a storage unit 22, a sequence directory unit 26, and a sequence controller 30. The prior art tester 10 also includes a clock 36. Each of the pins 11 are connected to a node of the device under test (DUT) 12, although in some embodiments a pin, such as 11A, may actually be connected to several nodes which are alternately addressed via a multiplexer in driver/compare logic 14A. The drive/compare logic units 14 each include circuitry which in response to data signals on lines 18 received from its associated vector storage unit 16 either places a voltage, determined by the data signals on lines 18, on the associated one of pins 11, or compares a voltage received on the pin to a voltage indicated by the signals on lines 18. Each of the vector storage units 16A is a RAM or other electronic storage device which holds in memory sets of signals, each set corresponding to a portion of a complete test vector. For example, if test pin 11A is a single test pin connected to a single node on the DUT 12, each set of signals may be a single signal selected from the group of possible signals, such as 0, 1, Z, H, L, X, where the meaning of each signal is given in Table 1.

TABLE I

| SIGNAL | MEANING OF SIGNAL |
| --- | --- |
| 0 | Place a logic 0 voltage on pin |
| 1 | Place a logic 1 voltage on pin |
| Z | Place pin in high impedance state |

TABLE I-continued

| SIGNAL | MEANING OF SIGNAL |
| --- | --- |
| L | Is pin in a logic 0 state? |
| H | Is pin in logic 1 state? |
| X | Pin in an unknown state. |

If the pin is connected to, say, four nodes, then the set of signals would be four signals, each of which is one of the signals given in Table I. A complete test vector is a vector comprising all the signals at a given address in all the vector storage units, 16A, 16B, 16C, 16D, etc. Each address in a vector storage unit, such as 16A, stores the portion of the complete vector that applies to its associated pin 11A. That is, in any given clock cycle, sequencer storage unit 24 applies the same address to each of the vector storage units 16 via address line 28. Each vector storage unit, such as 16A, will then apply the vector portion at that address to its associated drive/compare logic unit, such as 14A. If all these vector portions are strung together, the complete test vector, that is the complete signal applied during a given clock cycle to the DUT, is the result. The sequencer storage module is preferably a RAM or other electronic storage means, which stores sequences of test vector addresses. The sequence directory 26 in its simplest form may be a counter which increments a different sequence stored in sequencer storage 24 with each clock cycle of clock 36. In this case, none of the sequences stored in sequencer storage 22 would be repeated. However, in actual tests, sequences tend to repeat themselves often, because the structure of the DUT is generally very regular and repetitive. Thus, sequence directory 26 will generally be a RAM or other electronic storage device that has stored loops, subroutines etc. which are addressed and initiated by sequencer controller 30 via line 34. Sequence controller 30 may be a microprocessor, computer, or custom wired control unit depending on the tester. The sequencer directory unit 26 provides information to sequence controller 30 via line 32 telling it when it has completed a loop, subroutine or other instruction. The clock 36 provides test initiation and timing signals to the sequence controller 30. The vector portions of the unique test vectors applicable to each test pin, such as 11A, are loaded in to each of the associated vector storage units, such as 16A, via a data port, such as 20A. Likewise the sequences of vectors are loaded into the sequence storage unit 22 via data port 23, and the data necessary to operate the sequence directory 26 and sequence controller 30 are loaded into sequence directory 26 via data port 29.

The vector storage units 16 of the prior art store unique complete test vectors. Since only the unique vectors are stored, the vector storage units 16, the sequencer storage unit 24, and the sequencer directory 26 store the complete test in compressed form. This may be illustrated by a simple example. Assume that there are five tester pins 11 in a circuit tester 10, each pin connected to a single node of the DUT 12. Therefore there will be five vector storage units 16, and each address in a vector storage unit, would store a single signal. A complete test vector would consist of the five signals stored at a given address in the five vector storage units 16. Assume further, that the complete test comprises eight test vectors. An example of a complete test and the unique test vectors in the test are shown in Table II.

TABLE II

| CLOCK CYCLE | SIGNAL OUTPUT BY VECTOR STORAGE UNIT NO.: | | | | | UNQ. VCTR. |
| --- | --- | --- | --- | --- | --- | --- |
| | 1 | 2 | 3 | 4 | 5 | |
| 1 | 0 | 0 | 0 | 0 | H | a |
| 2 | 0 | 0 | 0 | 1 | H | b |
| 3 | 0 | 0 | 0 | 0 | H | c |
| 4 | 0 | 1 | 0 | 0 | L | d |
| 5 | 1 | 1 | 0 | 0 | H | e |
| 6 | 0 | 1 | 0 | 0 | H | f |
| 7 | 0 | 1 | 1 | 1 | L | g |
| 8 | 0 | 0 | 0 | 1 | H | b |

As shown in Table II, the first through fourth vector storage unit output a "0" signal on the first clock cycle, while the fifth vector storage unit outputs an "H" signal. Thus the complete test vector output on the first clock cycle is 0000H. This vector is labeled "a" in the last column. In the second clock cycle the vector 0001H is output, which vector is different from the vector "a" and is labeled vector "b". Likewise in the third through sixth clock cycles unique vectors are output and are labeled "c" through "g". In the seventh clock cycle the vector 0001H is output, which vector is the same as the vector "b" output in the second clock cycle. Thus for this test the number of vectors stored is compressed from the eight total vectors to the seven unique vectors. Generally, of course, tests involve a much larger number of vectors and the compression is correspondingly greater.

DESCRIPTION OF THE PREFERRED EMBODIMENT

1. Overview.

Figure 2:
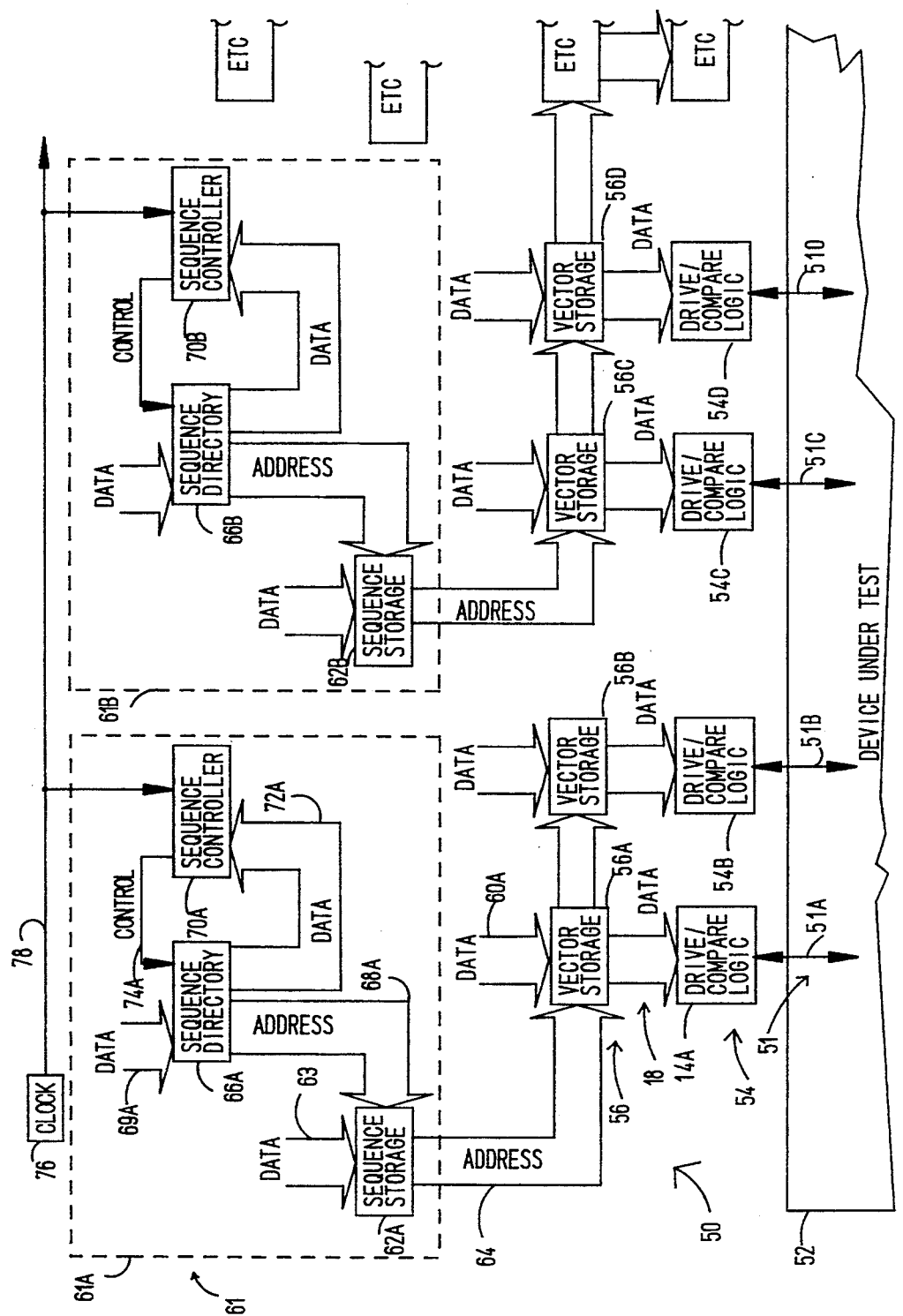
FIG. 2 is a block diagram of a preferred embodiment of the circuit tester according to the invention.

Turning now to FIG. 2, there is shown a circuit tester 50 according to the preferred embodiment of the invention. It should be understood that the particular embodiments described herein are exemplary, and are described in detail to more clearly and fully depict the invention than would otherwise be possible; they are not meant to limit the invention to these particular embodiments. In the circuit tester 50 according to the invention, we will assume that there are the same number of tester pins 51 and vector storage units 56 as in the prior art tester 10 of FIG. 1. However, there are a plurality of sequencers 61, such as 61A, 61B, etc., with each sequencer including a sequencer storage unit, such as 62A, a sequence directory unit, such as 66A, and a sequence controller, such as 70A. Each sequencer, such as 61A, is independent of the other sequencers 61 except for the common clock 76. Each sequencer, such as 61A, and its associated vector storage units, such as 56A and 56B, store an independently compressed segment of the complete test. When all the sequencers 61 are initiated and clocked in synchrony by clock 76 so that they run coincidently, the complete test is generated.

2. Detailed Description of the Tester and Compression.

The exemplary preferred embodiment of the invention shown in FIG. 2 has one sequencer 61 for every two pins 51 and vector storage units 56. This ratio of sequencers 61 to pins 51 and vector storage units 56 is exemplary in order to more easily describe the invention. In practice there will preferably be a larger number of vector storage units 56 per sequencer, for example, a tester may have two sequencers 61 and a hundred vector storage units 56. However, since each sequencer 61 is independent, any arrangement of sequencers 61 to pins 51 and vector storage units 56 is possible. There may be one sequencer for each pin and vector storage unit, or one sequencer for every three pins, etc. Or one sequencer may control one number of pins and vector storage units, say five, while another sequencer controls another number of pins and vector storage units, say twenty-three.

As indicated above, the tester pins 51 and drive/compare logic units 54, and the connection of the pins 51 to the DUT nodes may be identical to those of the prior art tester 10 for an identical test. There may also be an equal number of vector storage units 56, although, these storage units can be significantly smaller, since, as we shall see below, the compression is greater. Assuming the test to be performed is the same, the same signals are passed from each vector storage unit, such as 56A, to its associated drive/compare logic unit, such as 54A, on data lines 18, although the signals are stored in a more compressed form in the vector storage units 56. As in the prior art, the signals are one of the following possible states: 0, 1, Z, H, L, and X, where the meaning of the signals are given in Table I. Again each sequence storage unit, such as 62A, passes addresses to its associated vector storage units, such as 56A and 56B on address lines 64. The address passed by a given sequencer storage unit, such as 62A, to each of the associated units, such as 56A and 56B, will again be the same for each clock cycle, however, in general, each sequence storage unit, such as 62A, will pass different addresses to its associated vector storage units than the other sequence storage units, such as 62B, pass to their vector storage units. Each sequencer 61 is similar to the single sequencer 21 of the prior art tester of FIG. 1, including a sequence storage unit, such as 62A, which is preferably a RAM of other electronic storage device, a sequence directory, such as 66A, which is also preferably a RAM or other electronic storage device, and a sequence controller, such as 70A, which is preferably a microprocessor, a computer, or a hard wired processor, However, the data input via data ports 63 and 69A, etc. will be different. Likewise each of the sequencers, such as 61A has a data line, such as 72A, and a control signal/address line, such as 74A communicating between the sequence directory, such as 66A, and the sequence controller, such as 70A. The clock input on line 78 is the same for all sequencers 61. In the preferred embodiment of the invention, the vector storage RAMs 56 are 4K RAMs, and the sequencer storage RAMs are 12 bits wide.

Each set of vector storage units, such as 56A and 56B, associated with a sequencer, such as 61A, stores a part of a complete vector, which we shall call a segment of a vector. Importantly each segment is independently compressed, and only the unique segments are stored. This is probably easiest to understand in terms of the complete test matrix, which, as discussed above is comprised of the complete test vectors arranged sequentially so that each of the columns of the matrix are associated with a test pin, and each of the rows of the matrix corresponding to the complete test vector at a given clock cycle of the tester. In the prior art, the compression is done to the matrix as a whole by reducing it to only the unique complete test vectors. In the compression according to the invention, the test matrix is divided into matrix segments, preferably by separating it into independent groups of columns. For example, a matrix of two hundred columns may be divided into two separate matrixes of a hundred columns each, or a hundred matrixes of two columns each. To illustrate this independent compression, we return to the sample test given in Table II above. We again assume that there are five tester pins 51 in a circuit tester 50 according to the invention, each pin connected to a single node of the DUT 52. Again there will be five vector storage units 56, and each address in a vector storage unit would store a single signal. A complete test vector would consist of the five signals stored at a given address in the five vector storage units 56. Again we assume further, that the complete test comprises the same eight test vectors. However this time, instead of compressing the complete test vector, the compression will be done by segments. We will assume there are two sequencers, one associated with the first three vector storage units, and the other associated with the forth and fifth vector storage units. The result is shown in Table III.

TABLE III

| CLK CYCL | FIRST SEGMENT UNQ. VTR. SEG. | SIGNAL OUTPUT BY VECTOR STORAGE UNIT NO.: | | | | | SECOND SEGMENT UNQ. VTR. SEG. |
|---|---|---|---|---|---|---|---|
| | | 1 | 2 | 3 | 4 | 5 | |
| 1 | 1a | 0 | 0 | 0 | 1 | H | 2a |
| 2 | 1a | 0 | 0 | 0 | 1 | H | 2a |
| 3 | 1a | 0 | 0 | 0 | 0 | H | 2b |
| 4 | 1b | 0 | 1 | 0 | 0 | L | 2c |
| 5 | 1c | 1 | 1 | 0 | 0 | H | 2b |
| 6 | 1b | 0 | 1 | 0 | 0 | H | 2b |
| 7 | 1d | 0 | 1 | 1 | 1 | L | 2d |
| 8 | 1a | 0 | 0 | 0 | 1 | H | 2a |

As shown in Table III, the first test vector segments compress to four unique test vector segments: 1a, 1b, 1c, and 1d, and the second vector segments also compress to four unique test vector segments: 2a, 2b, 2c, and 2d. Comparing this to the prior art circuit tester where, for the same test, the eight vectors only reduced to seven unique vectors, we see that for this test the prior art vector storage RAMs 16 would have had to had storage space for seven addresses, while the vector storage RAMs 56 of the circuit tester according to the invention only have to have storage space for four addresses.

Each sequence storage unit, such as 62a, preferably stores sequences addresses of unique test vector segments stored in the vector storage units, such as 56A and 56B, connected to it. These sequences are called up and output on the address line 63 connected between the sequence storage unit, such as 62A, and its associated vector storage units, such as 56A and 56B, in response to output by its associated sequence directory, such as 66A. However, each sequence storage unit, such as 62A, may also simply store all the sequences of unique vector segments in chronological order, and the associated sequence directory, such as 66A, may simply be a counter which counts down and sequentially activates each of the addresses in the sequence storage unit 62A. Many other arrangements are also possible, so long as the sum of the information stored in the vector storage units 56, the sequence storage units 62, and the sequence directories 66 equals the complete test to be performed.

As the number of tester pins and sequencers go up, the differences in compression between the prior art and the invention increases significantly. Theoretically, each segment of the circuit tester according to the invention would compress to the nth root of the compression of the prior art circuit tester. That is, if there were 200 test connectors in a particular circuit tester, there would be $6^{200}$ possible unique vectors since there are 6 different possibilities for the individual test connector state, i.e., 0, 1, Z, L, H, and X. If you use only two sequencers, this reduces the possible unique vector segments to $6^{100}$, and if there are eight sequencers, the possible unique vector segments reduces to $6^{25}$. In an actual test, the savings is not as much since the size of a typical test would be much less that $6^{200}$, however, it still is considerable, and since the price of RAMs comes down rapidly with size, the invention yields significant cost savings. Further, the time and complexity of loading data into the RAMS, and the size of storage space on disks or other non-volatile storage devices is also considerably reduced.

There has been described a novel circuit tester which provides significant compression of data as compared to the prior art, and has many other advantages. It should be understood that the particular embodiment shown in the drawings and described within this specification is for purposes of example and should not be construed to limit the invention which will be described in the claims below. Further, it is evident that those skilled in the art may now make numerous uses and modifications of the specific embodiment described, without departing from the inventive concepts. For example, the invention can be applied to other circuit tester designs. Pin signals or pin states in addition to or other than the 0, 1, Z, H, L, X signals as described in the preferred embodiment may be used. A vector storage unit may be a portion of a Ram or other electronic storage device, or comprise several RAMs or other storage devices. A test matrix may be segmented differently. Or equivalent components or circuits can be substituted for the various components and circuits described. Additional features may be added. A greater or lesser number of parts may be used. Consequently, the invention is to be construed as embracing each and every novel feature and novel combination of features present in and/or possessed by the circuit tester described.

What is claimed is:

1. An electronic circuit tester comprising:
    a plurality of conductors for providing an electrical connection to an electronic device to be tested;
    a plurality of vector storage units, each vector storage unit storing one or more vector segment signals, each vector segment signal corresponding to at least a portion of a unique test vector segment of a test vector;
    a plurality of driver/comparator means for applying an electrical signal to one of said conductors in response to a vector segment signal received from one of said vector storage units and for receiving an electrical signal on one of said conductors and comparing it to a vector segment signal received from one of said vector storage units;
    a plurality of sequencer means, each electrically connected to one or more of said vector storage units, each of said plurality of sequencer means for storing an independently compressed segment of test data and causing said one or more of said vector storage units to output said one or more vector segment signals; wherein each sequencer means controls less than all of said plurality of conductors of said device to be tested; and
    clock means for applying a timing signal to each of said sequencer means.

2. An electronic circuit tester of claim 1 where each of said sequencer means operates independently of the other of said sequencer means, except for said timing signal.

3. An electronic circuit tester as in claim 2 wherein each of said sequencer means comprises a sequence storage means for storing compressed test data relating to the portion the test applied and received by said driver/comparator means on said conductors associated with the vector storage units electrically connected to said sequencer means, each of said vector segment signals correspond to a portion of the total test matrix, and together all of said portions of said test vector segments stored in said vector storage units plus the compressed test data stored in said sequence storage means reconstruct the entire test matrix.

4. An electronic circuit tester as in claim 3 wherein said compressed test data stored in each of said sequence storage means comprises unique sequences of unique test vectors.

5. An electronic circuit tester as in claim 1 wherein said clock means comprises a means for applying an initiation signal and a synchronizing signal to said sequencer means.

6. An electronic circuit tester as in claim 1 wherein each of said vector storage units comprises a RAM.

7. An electronic circuit tester as in claim 1 wherein each of said sequencer means comprises a sequencer storage unit, a sequencer directory, and a sequence controller.

8. An electronic circuit tester as in claim 1 wherein the same number said vector storage units are electrically connected to each of said sequencer means.

9. An electronic circuit tester comprising:
    a plurality of conductors for providing an electrical connection to an electronic device to be tested;
    a plurality of vector storage units, each unit storing one or more test vector signals, each signal corresponding to at least a portion of a test vector;
    a plurality of driver/comparator means for applying an electrical signal to one of said conductors in response to a test vector signal received from one of said vector storage means and receiving an electrical signal on one of said conductors and comparing it to a test vector signal received from one of said vector storage units; and
    a plurality of sequencer means, each of said plurality of sequencer means for storing an independently compressed segment of test data and causing one or more of said vector storage units to output said one or more test vector signals, wherein each sequencer means controls less than all of said plurality of conductors of said device to be tested; and
    clock means for applying a timing signal to each of said sequencer means; and
    wherein each of said sequencer means operates independently of the other of said sequencer means, except for said timing signal, and the test data stored in each of said sequencer means is independent of the test data stored in the other of said sequencer means.

10. An electronic circuit tester as in claim 9 wherein said compressed test data stored in each of said sequencer means comprises unique sequences of unique test vectors.

11. A method of testing an electronic circuit comprising the steps of:
    providing a complete test matrix;

dividing said complete test matrix into matrix segments;

independently compressing each matrix segment to a set of unique vector segments;

storing each set of unique vector segments in one or more vector storage units; and simultaneously sequencing each set of stored unique vector segments to reproduce said complete test matrix.

12. A method of testing an electronic circuit as in claim 11 wherein said step of sequencing comprises storing unique sequences of vector segments corresponding to each of said matrix segments and applying said unique sequences to said vector storage units to produce said test.

13. A method of testing an electronic circuit as in claim 12 wherein said vector storage units comprise electronic storage devices with said unique vector segments stored at various addresses, and said step of sequencing comprises applying the addresses corresponding to said unique sequences to said electronic storage devices to cause said electronic storage devices to simultaneously output preselected ones of said unique vector segments to reproduce said complete test matrix.

14. A method of testing an electronic circuit as in claim 11 wherein there are a plurality of said vector storage units, and said step of storing comprises dividing each unique vector segment into two or more portions and storing each portion in a different one of said vector storage units.

* * * * *